(12) United States Patent
Bhatta et al.

(10) Patent No.: US 10,958,279 B1
(45) Date of Patent: Mar. 23, 2021

(54) PARTITIONED DIGITAL-TO-ANALOG CONVERTER SYSTEM

(71) Applicant: QUALCOMM Incorporated, San Diego, CA (US)

(72) Inventors: Debesh Bhatta, San Diego, CA (US); Kevin Jia-Nong Wang, Poway, CA (US); Karthik Nagarajan, Cupertino, CA (US); John Abcarius, San Diego, CA (US); Andrew Weil, San Diego, CA (US); Christian Venerus, San Diego, CA (US); Jeffrey Mark Hinrichs, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/563,083

(22) Filed: Sep. 6, 2019

(51) Int. Cl.
*H03M 1/66* (2006.01)
*H03M 1/06* (2006.01)
*H03C 3/09* (2006.01)
*H03M 1/70* (2006.01)

(52) U.S. Cl.
CPC ........ *H03M 1/0626* (2013.01); *H03C 3/0958* (2013.01); *H03M 1/70* (2013.01)

(58) Field of Classification Search
CPC .............................. H03M 1/0626; H03M 1/70
USPC ................................................... 341/144, 111
See application file for complete search history.

(56) References Cited

U.S. PATENT DOCUMENTS

| | | | |
|---|---|---|---|
| 9,130,586 B1* | 9/2015 | Raz ....................... | H03M 1/662 |
| 9,577,657 B1* | 2/2017 | Clara .................... | H03M 1/109 |
| 9,819,351 B2* | 11/2017 | Hiraku ................. | H03L 7/0891 |
| 10,715,169 B1* | 7/2020 | Aouini .................... | H03M 1/68 |
| 2005/0017802 A1* | 1/2005 | Robinson ................. | H03F 1/32 330/151 |
| 2007/0085719 A1* | 4/2007 | Maxim .................. | H03D 7/166 341/144 |
| 2018/0367171 A1* | 12/2018 | Jacob ..................... | H03F 1/223 |

* cited by examiner

*Primary Examiner* — Peguy Jean Pierre
(74) *Attorney, Agent, or Firm* — Patterson+ Sheridan, L.L.P.

(57) ABSTRACT

Certain aspects of the present disclosure provide apparatus and techniques for digital-to-analog conversion. One example apparatus generally includes a first digital-to-analog converter (DAC) having an input coupled to a digital input node of the apparatus, a second DAC, a digital processor coupled between the digital input node and an input of the second DAC, and a combiner coupled to the first DAC and the second DAC.

20 Claims, 7 Drawing Sheets

PARTITIONED DIGITAL-TO-ANALOG CONVERTER SYSTEM

FIELD OF THE DISCLOSURE

The present disclosure generally relates to electronic circuits, and more particularly, to techniques and apparatus for digital-to-analog conversion.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless communication devices include digital-to-analog converters (DACs) which may be used to convert signals from the digital domain to the analog domain. For instance, a DAC may be used to convert a digital signal input to a digitally controlled oscillator (DCO) to an analog signal in order to control a voltage-controlled oscillator (VCO) of the DCO.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to an apparatus for digital-to-analog conversion. One example apparatus generally includes a first digital-to-analog converter (DAC) having an input coupled to a digital input node of the apparatus, a second DAC, a digital processor coupled between the digital input node and an input of the second DAC, and a combiner coupled to the first DAC and the second DAC.

Certain aspects of the present disclosure are directed to a method for signal processing. One example method generally includes converting a digital input signal to a first analog signal via a first DAC, generating a filtered digital signal by applying a digital filter to the digital input signal, converting the filtered digital signal to a second analog signal via a second DAC, and combining the first analog signal and the second analog signal to generate an analog output signal.

Certain aspects of the present disclosure are directed to an apparatus for signal processing. One example apparatus generally includes means for converting a digital input signal to a first analog signal; means for generating a filtered digital signal by applying a digital filter to the digital input signal; means for converting the filtered digital signal to a second analog signal; and means for combining the first analog signal and the second analog signal to generate an analog output signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
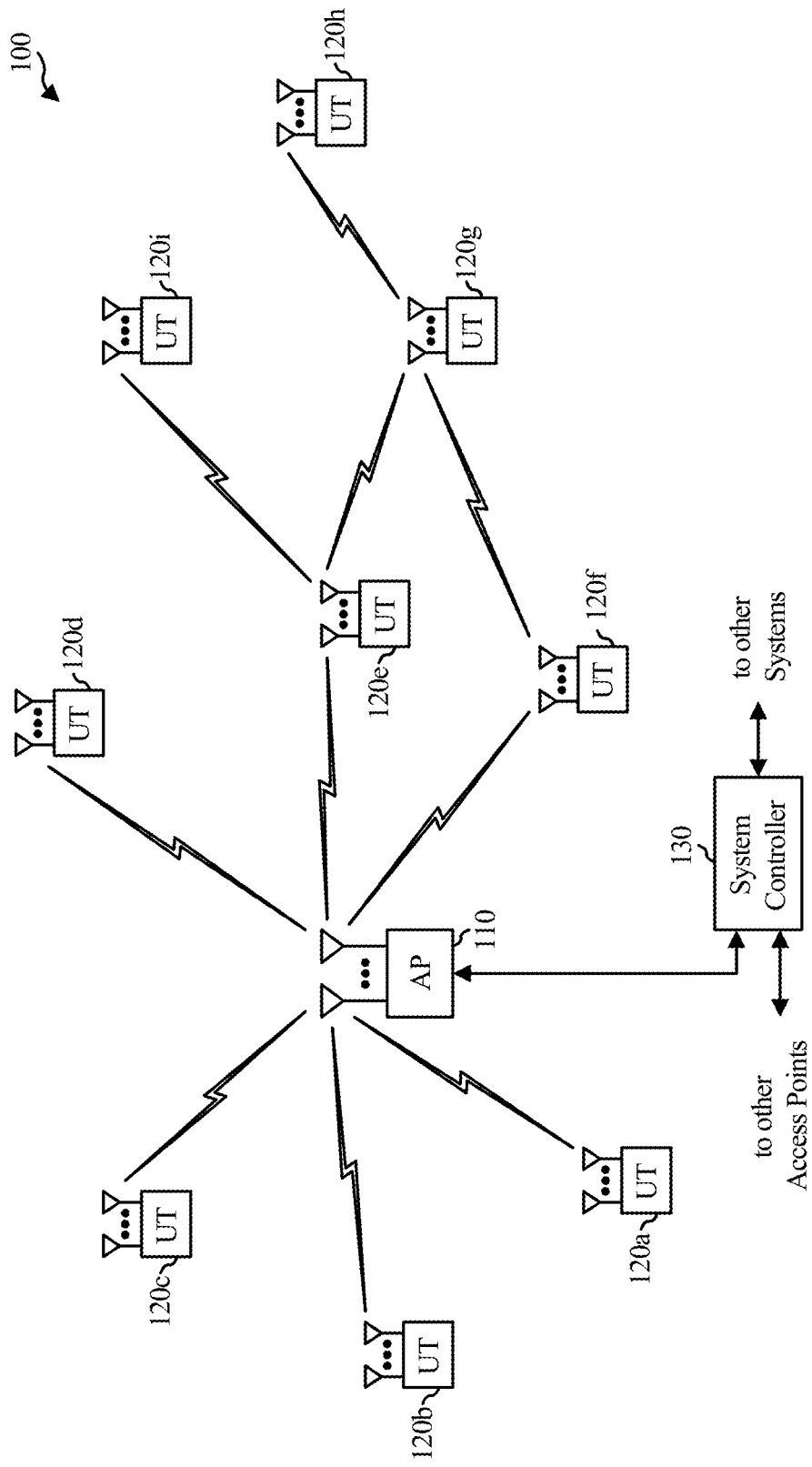
FIG. 1 illustrates a wireless communications system with access points and user terminals, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include local oscillator (LO) generation circuitry having a phase-locked loop (PLL) implemented with a partitioned digital-to-analog converter (DAC) system, as described in more detail herein.

Figure 2:
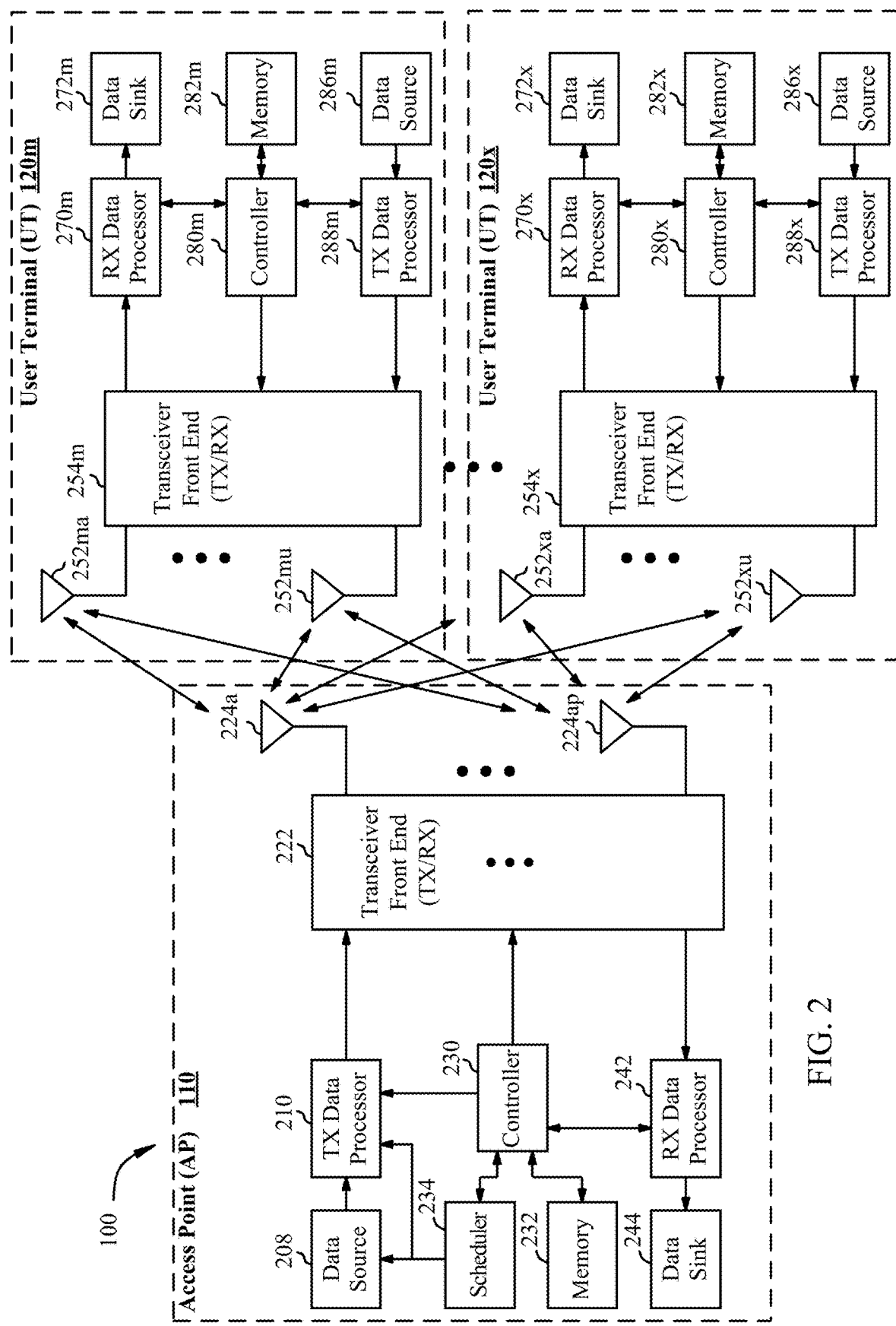
FIG. 2 is a block diagram illustrating an access point and two user terminals of a wireless system, in which aspects of the present disclosure may be practiced.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include LO generation circuitry having a PLL implemented with a partitioned DAC system, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
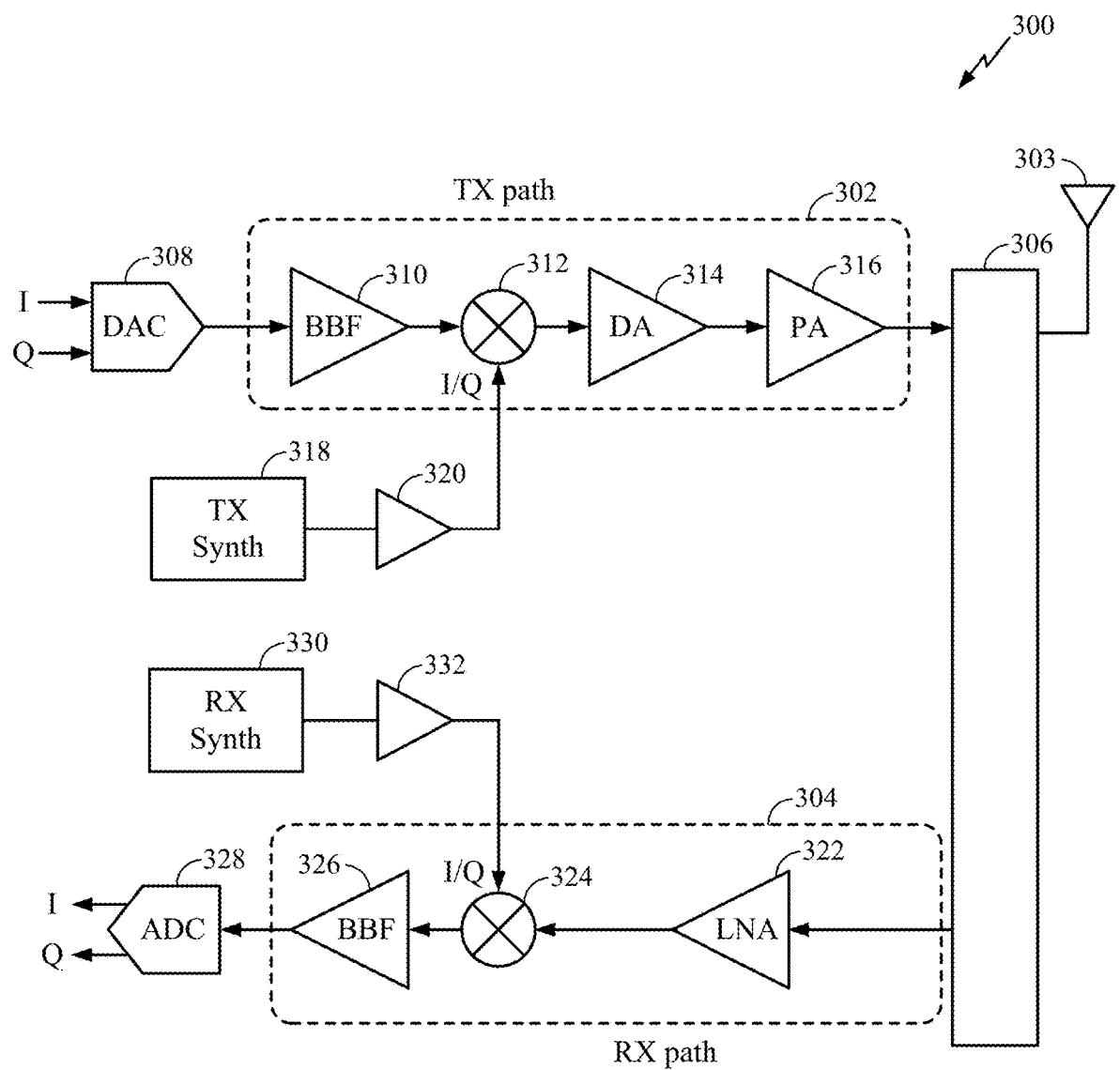
FIG. 3 is a block diagram of an example transceiver front-end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects, the TX frequency synthesizer 318 and/or the RX frequency synthesizer 330 may include LO generation circuitry having a PLL implemented with partitioned digital-to-analog converters (DACs), as described in more detail herein.

While FIGS. 1-3 provide a wireless communication system as an example application in which certain aspects of the present disclosure may be implemented to facilitate understanding, certain aspects described herein may be used for signal generation in any of various other suitable systems (e.g., any electronic system).

Example Partitioned Digital-to-Analog Converter System

Figure 4:
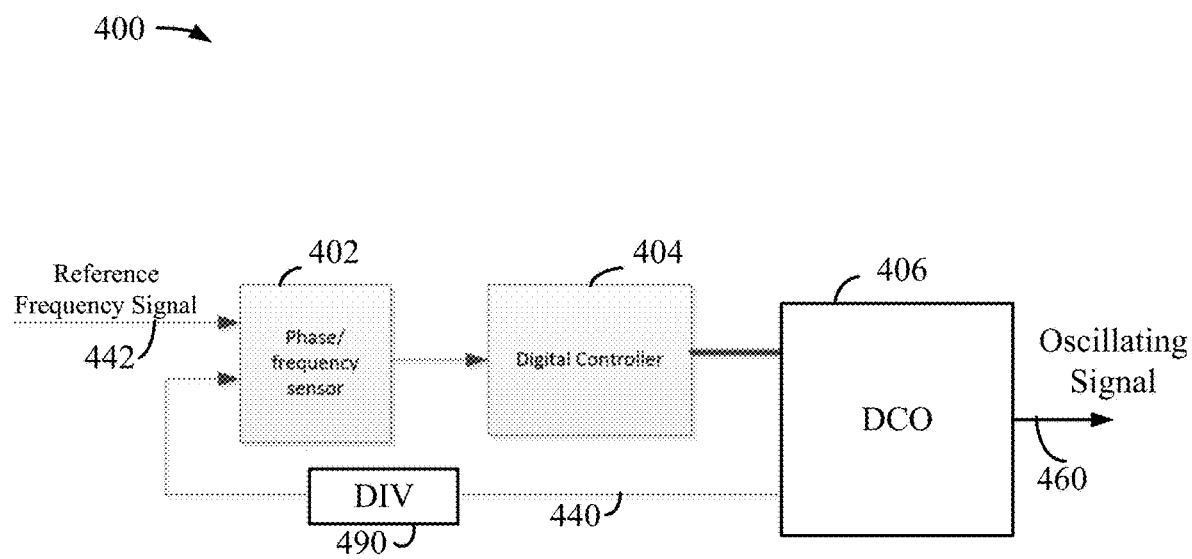
FIG. 4 illustrates a digital phase-locked loop (PLL), in accordance with certain aspects of the present disclosure.

FIG. 4 illustrates a digital phase-locked loop (PLL) 400, in accordance with certain aspects of the present disclosure. As illustrated, the PLL 400 includes a frequency and/or phase sensor 402 (also referred as a phase/frequency sensor) that compares a phase and/or frequency of a reference frequency signal (e.g., at the reference frequency node 442) to a feedback signal and controls a digital controller 404 in an attempt to lock the frequency and/or phase of the feedback signal (e.g., representing an oscillating signal generated by the PLL 400) with the frequency and/or phase of the reference frequency signal. The digital controller 404 generates a digital word having N bits that is provided to a digitally controlled oscillator (DCO) 406, N being an integer greater than 1. Based on the digital word input to the DCO 406, the DCO 406 generates the oscillating signal at the PLL output node 460 and the feedback signal to be fed back to the phase sensor 402 via the feedback path 440, as described herein. In certain aspects, a frequency divider 490 having a divider ratio equal to or greater than 1 may be in the feedback path between the DCO 406 and the frequency and/or phase sensor 402, as illustrated.

The area of the digital PLL may be dominated by the area under the digitally controlled tuning component(s) used to achieve the tuning range and quantization noise level in the DCO 406. In some implementations, the tuning component(s) may include a DAC providing an analog signal to an oscillator having a frequency that is controlled by an analog tuning signal. One way of reducing the area consumption of a DAC is to use a partitioned DAC. For example, two or more DACs may be used to convert a digital signal to an analog signal in a parallel fashion, as described in more detail herein.

Moreover, it is important for the DAC in the DCO 406 to have a relatively large dynamic range to meet the frequency tunability range, smooth slew specification, operating supply, and temperature range for various applications. However, most of the dynamic range of a DAC used in a PLL may be used to offset slow drifts induced by slow flicker noise, temperature drifts, and supply drift. In other words, most of the dynamic range of the DAC is implemented for variations that are relatively low in frequency. Certain aspects of the present disclosure are directed to an implementation of a DAC partition with reduced area consumption as compared to conventional implementations. In certain implementations, one DAC may focus on digital-to-analog conversion of relatively low-frequency components of a digital input signal and be implemented with relatively high dynamic range, and another DAC may focus on digital-to-analog conversion of relatively high-frequency components of a digital input signal and be implemented with relatively high dynamic range, as described in more detail herein.

Figure 5:
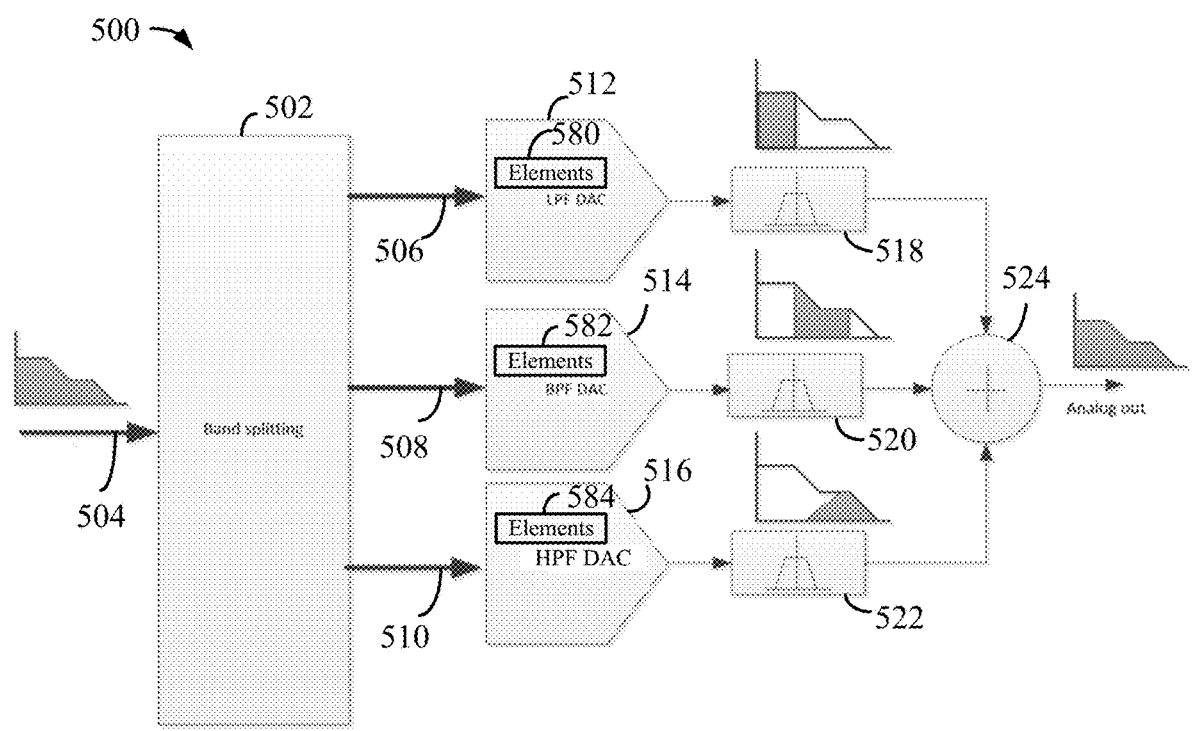
FIG. 5 is a block diagram of a partitioned digital-to-analog converter (DAC) system, in accordance with certain aspects of the present disclosure.

FIG. 5 is a block diagram of a partitioned DAC system 500, in accordance with certain aspects of the present disclosure. As illustrated, the partitioned DAC system 500 includes a band-splitting module 502 that receives a digital bitstream 504 and generates bitstreams 506, 508, 510 provided to a low-pass filter (LPF) DAC 512, a band-pass filter (BPF) DAC 514, and a high-pass filter (HPF) DAC 516. For example, the band-splitting module 502 may provide a low-pass-filtered version of the digital bitstream 504 to the LPF DAC 512, a band pass filtered version of the digital bitstream 504 to the BPF DAC 514, and a high-pass filtered version of the digital bitstream 504 to the HPF DAC 516.

The LPF DAC 512 may be coupled to a LPF 518, the BPF DAC 514 may be coupled to a BPF 520, and the HPF DAC 516 may be coupled to a HPF 522. In other words, the low-pass path having the LPF DAC 512 and the LPF 518 may implement a relatively slow digital-to-analog conversion operation having a slower conversion speed as compared to the band-pass path having the BPF DAC 514 and the BPF 520. Moreover, the high-pass path having the HPF DAC 516 and the HPF 522 may implement a relatively fast digital-to-analog conversion operation having a faster conversion speed as compared to the band-pass path having the BPF DAC 514 and the BPF 520. As illustrated, the outputs of the LPF 518, the BPF 520, and the HPF 522 are coupled to inputs of a combiner (e.g., summer 524) that may be used to generate an analog output.

The conversion speed of a DAC may be set using various mechanisms. For example, the rate of update of the digital code at the input of the DAC may be set to control the conversion speed of the DAC, as described in more detail herein. For instance, a slow DAC (e.g., LPF DAC) input code may be updated at a rate which is slower than a fast DAC input code (e.g., HPF DAC input code), as set by the band-splitting module 502 or any digital controller. A digital filter at the input of a DAC may also be used to effectively limit the rate of change of code words, albeit with the same update rate. In a closed loop response with a slower update rate for the slow DAC, the input code filtering may be performed implicitly by the feedback loop.

Another mechanism for setting the conversion speed of the DAC involves the analog response time of the DAC output waveform (e.g., how fast the DAC output changes when the input code is changed). For instance, the DAC output may be passed through a low pass filter (e.g., LPF 518) leading to a slow response time of the DAC output. In the presence of the analog filter at the DAC output, the DAC output voltage after analog filtering may change only as fast as the filter bandwidth allows.

As presented above, most of the dynamic range of the digital-to-analog conversion for the PLL may be associated with slow variations in the digital bitstream. Therefore, in certain aspects, the dynamic range of the LPF DAC 512 (e.g., slow DAC) may be greater than the dynamic range of the BPF DAC 514, and the dynamic range of the BPF DAC 514 may be greater than the dynamic range of the HPF DAC 516 (e.g., fast DAC).

The dynamic range of a DAC generally refers to the ratio of the maximum range of the DAC output to the minimum resolution of the DAC output. The dynamic range of the DAC is a design parameter which, along with the other specifications of the DAC (e.g., speed of the DAC operation, noise, linearity, etc.) impacts the DAC area consumption. For instance, the dynamic range of a DAC may be set by implementing the DAC from unit elements (e.g., current sources), where each element determines the resolution and the total number of elements determine the dynamic range of the DAC. For example, the number of unit elements 580 of the LPF DAC 512 (e.g., slow DAC) may be less than the number of unit elements 582 of the BPF DAC 514, and the number of unit elements 582 may be less than the number of unit elements 584 of the HPF DAC 516 (e.g., fast DAC). The area of the DAC may increase as the dynamic range of the DAC increases, but the area is also impacted by other factors such as a higher speed of response, higher linearity specification, and lower noise specification.

In certain aspects of the present disclosure, a slow DAC is used to achieve an area saving by making the slow DAC have a large dynamic range while relaxing the linearity requirement, speed of response, noise, etc. Since the range of output of the slow DAC is larger, its dynamic range is larger. This is important because the fast DAC has higher cost and is designed to have a lower dynamic range. As such, the fast DAC may be unable to provide enough range to cover all frequencies and the temperature drift compensation.

While the partitioned DAC system 500 includes three partitions (e.g., three digital-to-analog conversion paths), any number of partitions may be used. For example, the partitioned DAC system of the DCO 406 may include two or more partitions.

In certain aspects, the LPF DAC 512 may be monotonic. A DAC is monotonic if the analog output of the DAC only increases as the DAC-code input increases. The dynamic range of the LPF DAC 512 may be traded off with additional filtering in the path (e.g., with addition of LPF 518 in the low-pass path) to remove out-of-band noise and with additional dynamic range for the fast DAC. In other words, a reduction in the dynamic range of the LPF DAC 512 may be offset by an increase in the dynamic range of the BPF DAC 514 and/or HPF DAC 516. The dynamic range of the IPF DAC 516 may be set in accordance with the oscillator noise and loop bandwidth of a PLL in which the partitioned DAC system 500 may be implemented, as described in more detail herein.

Figure 6:
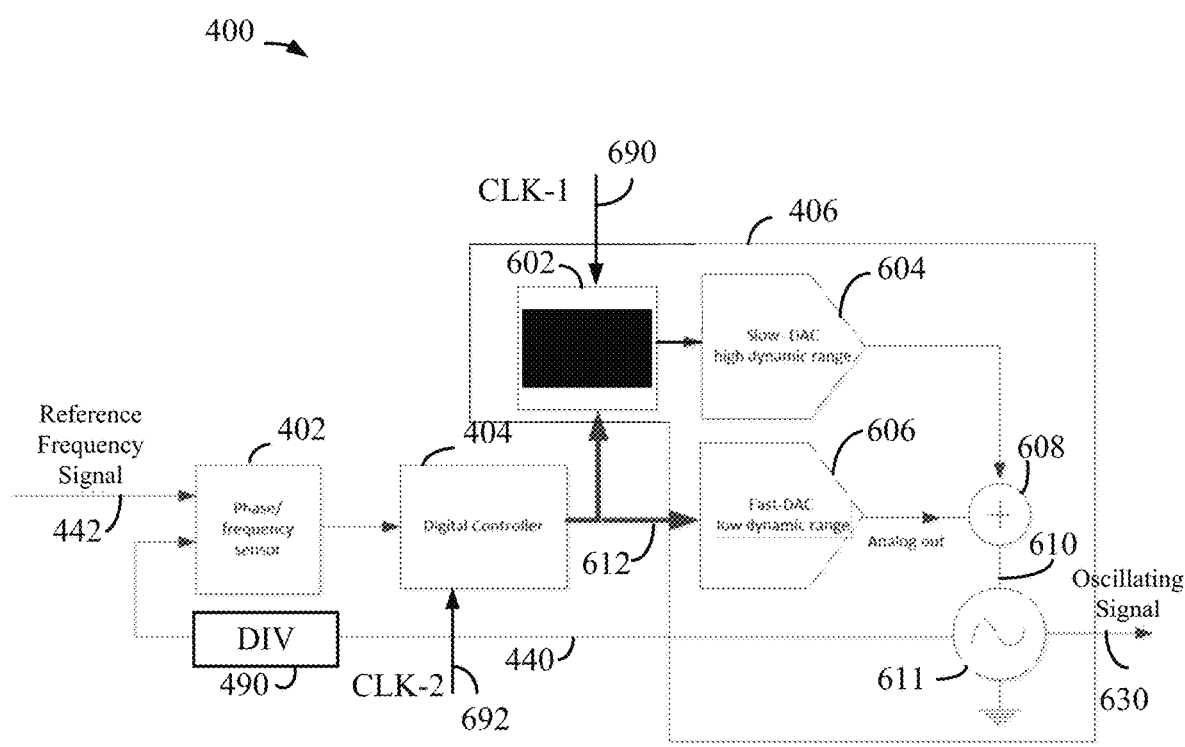
FIG. 6 illustrates a PLL having a digitally controlled oscillator (DCO) implemented with a partitioned DAC system, in accordance with certain aspects of the present disclosure.

FIG. 6 illustrates the PLL 400 having the DCO 406 implemented with a partitioned DAC system having two DAC partitions, in accordance with certain aspects of the present disclosure. While FIG. 5 illustrates an open loop system having a partitioned DAC implemented with various analog filters, the partitioned DAC system of FIG. 6 is part of a closed loop system and is implemented using filtering that is inherent to the loop. As illustrated, the DCO 406 includes a slow DAC 604 and a fast DAC 606. The slow DAC 604 generates an analog signal that is combined (e.g., summed, via a summer 608), with an analog signal generated by the fast DAC 606 to generate a summer output signal at a tuning input node 610 of a VCO 611. The oscillating signal at the output 630 of the VCO 611 is generated based on the signal at the tuning input node 610.

In certain aspects, the fast DAC 606 and the summer 608 may be implemented by the VCO 611. For instance, the VCO 611 may include tunable capacitive elements. The fast DAC operation may involve tuning the capacitive elements via a fast DAC digital input code, and the output of the slow DAC 604 may be used to drive the tuning voltage of the VCO 611.

In certain aspects, the slow DAC 604 centers the summer output signal at the tuning input node 610. For example, a digital controller 602 may receive the digital input 612 and generate a center DAC code that is provided to the slow DAC 604 for digital-to-analog conversion. For example, the digital controller 602 may perform digital low-pass filtering of the digital input signal at the digital input 612 to generate the digital input to the slow DAC 604. As one example, the digital controller 602 may receive a clock signal 690 (CLK-1) that controls the rate at which the digital code to the slow DAC 604 is updated. The clock signal 690 may have a lower frequency than a clock signal 692 (CLK-2) provided to the digital controller 404, thereby effectively implementing a low-pass filter in the signal path having the DAC 604. Thus, the summer output signal (e.g., at the tuning input node 610 of the VCO 611) includes the analog output generated by the fast DAC 606 having a center set by the center DAC code.

In certain aspects, the slow DAC 604 may be monotonic. A DAC is monotonic if the analog output of the DAC only increases as the DAC-code input increases. The dynamic range of the slow DAC 604 may be traded off with additional filtering in the path (e.g., with addition of LPF 518 in the low-pass path) to remove out-of-band noise and with additional dynamic range for the fast DAC. In other words, a reduction in the dynamic range of the slow DAC 604 may be offset by an increase in the dynamic range of the fast DAC. The dynamic range of the fast DAC 606 may be set in accordance with the oscillator noise and loop bandwidth of the PLL 400.

Figure 7:
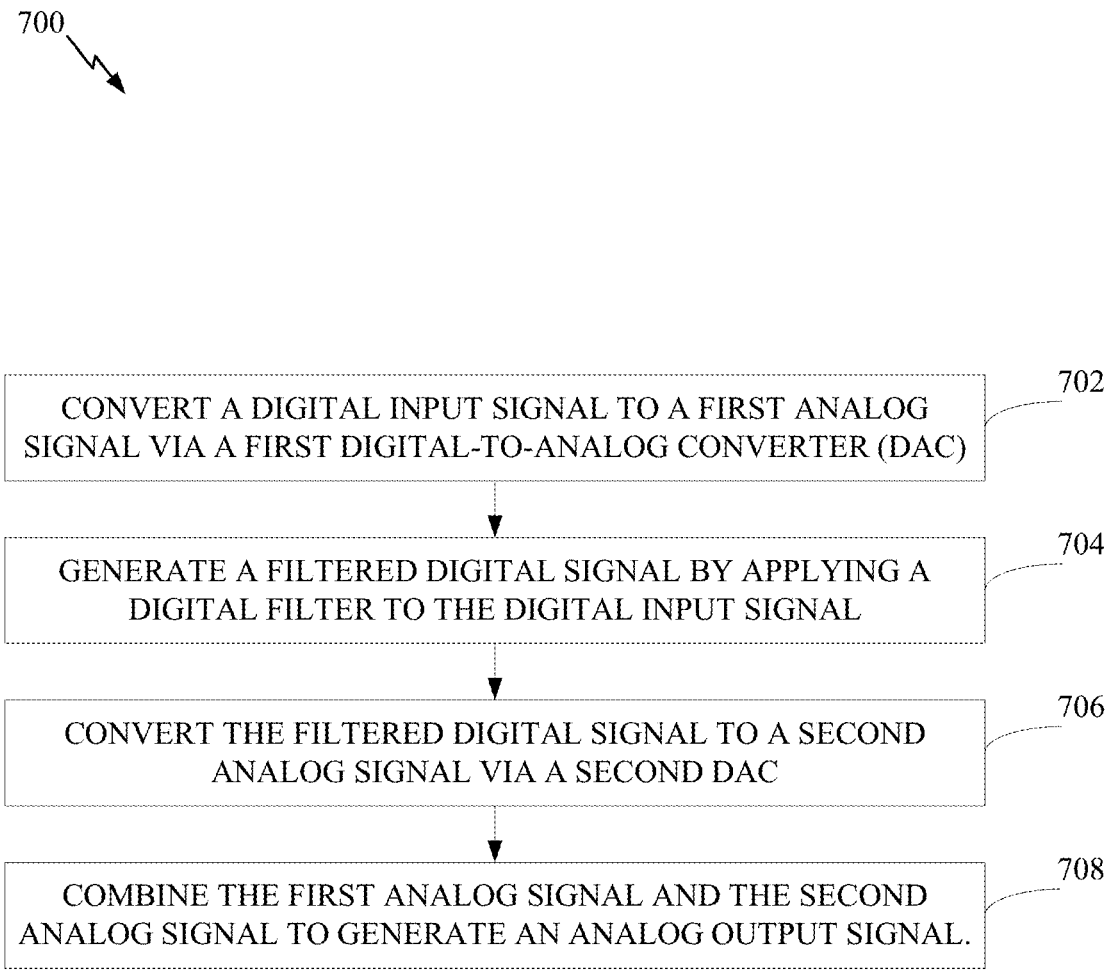
FIG. 7 is a flow diagram illustrating example operations for signal processing, in accordance with certain aspects of the present disclosure.

FIG. 7 is a flow diagram illustrating example operations 700 for signal processing, in accordance with certain aspects of the present disclosure. The operations 700 may be performed by signal processing circuitry such as a PLL (e.g., the PLL 400) and/or a DAC system (e.g., partitioned DAC system 500).

The operations 700 begin, at block 702, by the signal processing circuitry converting a digital input signal to a first analog signal via a first DAC (e.g., DAC 606). At block 704, the signal processing circuitry generates (e.g., via digital controller 602) a filtered digital signal by applying a digital filter to the digital input signal, at block 706, converts the filtered digital signal to a second analog signal via a second DAC, and at block 708, combines the first analog signal and the second analog signal to generate an analog output signal (e.g., via summer 608). In certain aspects, a dynamic range of the second DAC is higher than a dynamic range of the first DAC. In certain aspects, a digital-to-analog conversion speed of the second DAC is lower than a digital-to-analog conversion speed of the first DAC.

In some cases, applying the digital filter may include applying a low-pass digital filter to the digital input signal. In some cases, generating the filtered digital signal further may include preventing the first analog signal from saturating (e.g., reaching an output voltage limit of the first DAC). In certain aspects, the second DAC may be a monotonic DAC.

In certain aspects, the operations 700 may also include the signal processing circuitry generating, via a VCO (e.g., VCO 611), an oscillating signal based on the analog output signal, comparing (e.g., via phase sensor 402) a feedback signal to a reference frequency signal. The feedback signal may be representative of the oscillating signal. The operations 700 may also include the signal processing circuitry generating (e.g., via the digital controller 404) the digital input signal based on the comparison.

In certain aspects, generating the filtered digital signal may include setting a center of the analog output signal based on the digital input signal. In some cases, the operations 700 may also include applying a low-pass filter (e.g., via LPF 518) to the second analog signal. In this case, summing the first analog signal and the second analog signal may include summing the first analog signal and the low-pass filtered second analog signal.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more."

Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods are described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

What is claimed is:

1. An apparatus for digital-to-analog conversion, comprising:
    a first digital-to-analog converter (DAC) having an input coupled to a digital input node of the apparatus;
    a second DAC;
    a digital controller having an output coupled to the input of the first DAC;
    a digital processor coupled between the input of the first DAC and an input of the second DAC, wherein an input of the digital processor is coupled to the input of the first DAC and wherein an output of the digital processor is coupled to the input of the second DAC; and
    a combiner coupled to the first DAC and the second DAC, wherein the combiner is configured to combine an analog signal generated by the first DAC with an analog signal generated by the second DAC.

2. The apparatus of claim 1, wherein a dynamic range of the second DAC is higher than a dynamic range of the first DAC.

3. The apparatus of claim 2, wherein a digital-to-analog conversion speed of the second DAC is lower than a digital-to-analog conversion speed of the first DAC.

4. The apparatus of claim 3, further comprising at least one third DAC having an output coupled to the combiner, wherein a dynamic range of the third DAC is higher than a dynamic range of the second DAC.

5. The apparatus of claim 1, wherein the digital processor is configured as a low-pass digital filter.

6. The apparatus of claim 1, wherein the digital processor is configured to generate a digital input to the second DAC based on a digital signal at the digital input node to prevent an output signal generated by the first DAC from saturating.

7. The apparatus of claim 1, wherein the second DAC is a monotonic DAC.

8. A phase-locked loop (PLL) having the apparatus of claim 1, further comprising:
    a frequency or phase sensor having a first input coupled to a reference frequency node; and
    a voltage-controlled oscillator (VCO) having a tuning input node coupled to an output of the combiner, wherein a feedback path is coupled between the VCO and a second input of the phase sensor and wherein the digital controller is coupled between the frequency or phase sensor and the digital input node.

9. The PLL of claim 8, wherein a rate of change of a digital code generated by the digital controller is based on a first clock signal, and wherein a rate of change of a digital code generated by the digital processor is based on a second clock signal, the second clock signal having a lower frequency than the first clock signal.

10. The apparatus of claim 1, wherein the digital processor is configured to generate a digital input to the second DAC based on a digital signal at the digital input node, and wherein a center of an output signal generated by the combiner is set by the digital input to the second DAC.

11. The apparatus of claim 1, further comprising a low-pass filter coupled between the second DAC and the combiner.

12. A method for signal processing, comprising:
    generating, via a digital controller, a digital input signal provided to a first digital-to-analog converter (DAC);
    converting the digital input signal to a first analog signal via the first DAC;
    generating, via a digital processor, a filtered digital signal by applying a digital filter to the digital input signal, wherein the digital processor is coupled between an input of the first DAC and an input of a second DAC and wherein the filtered digital signal is provided to the input of the second DAC;
    converting the filtered digital signal to a second analog signal via the second DAC; and
    combining the first analog signal and the second analog signal to generate an analog output signal.

13. The method of claim 12, wherein a dynamic range of the second DAC is higher than a dynamic range of the first DAC.

14. The method of claim 13, wherein a digital-to-analog conversion speed of the second DAC is lower than a digital-to-analog conversion speed of the first DAC.

15. The method of claim 12, wherein applying the digital filter comprises applying a low-pass digital filter to the digital input signal.

16. The method of claim 12, wherein generating the filtered digital signal further comprises preventing the first analog signal from saturating.

17. The method of claim 12, further comprising:
    generating, via a voltage-controlled oscillator (VCO), an oscillating signal based on the analog output signal; and
    comparing a feedback signal to a reference frequency signal, wherein the feedback signal is representative of the oscillating signal, wherein the digital input signal is generated based on the comparison.

18. The method of claim 12, wherein generating the filtered digital signal comprises setting a center of the analog output signal based on the digital input signal.

19. The method of claim 12, further comprising applying a low-pass filter to the second analog signal, wherein summing the first analog signal and the second analog signal comprises summing the first analog signal and the low-pass filtered second analog signal.

20. An apparatus for signal processing, comprising:
    means for generating a digital input signal;
    means for converting the digital input signal to a first analog signal;
    means for generating a filtered digital signal by applying a digital filter to the digital input signal;

means for converting the filtered digital signal to a second analog signal, wherein:
  the means for generating the filtered digital signal is coupled between an input of the means for converting the digital input signal and an input of the means for converting the filtered digital signal;
  an input of the means for generating the filtered digital signal is coupled to the input of the means for converting the digital input signal; and
  an output of the means for generating the filtered digital signal is coupled to the input of the means for converting the filtered digital signal; and
means for combining the first analog signal and the second analog signal to generate an analog output signal.

* * * * *